US009460926B2

(12) United States Patent
Mallikarjunaswamy

(10) Patent No.: US 9,460,926 B2
(45) Date of Patent: Oct. 4, 2016

(54) FORMING JFET AND LDMOS TRANSISTOR IN MONOLITHIC POWER INTEGRATED CIRCUIT USING DEEP DIFFUSION REGIONS

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 4 days.

(21) Appl. No.: 14/320,434

(22) Filed: Jun. 30, 2014

(65) Prior Publication Data
US 2015/0380398 A1 Dec. 31, 2015

(51) Int. Cl.
H01L 27/06 (2006.01)
H01L 21/265 (2006.01)
H01L 29/78 (2006.01)
H01L 29/808 (2006.01)
H01L 29/66 (2006.01)
H01L 29/06 (2006.01)
H01L 29/10 (2006.01)
H01L 29/36 (2006.01)
H01L 21/8232 (2006.01)
H01L 27/085 (2006.01)

(52) U.S. Cl.
CPC ..... *H01L 21/26513* (2013.01); *H01L 21/8232* (2013.01); *H01L 27/085* (2013.01); *H01L 29/063* (2013.01); *H01L 29/1066* (2013.01); *H01L 29/1095* (2013.01); *H01L 29/36* (2013.01); *H01L 29/66681* (2013.01); *H01L 29/66901* (2013.01); *H01L 29/7823* (2013.01); *H01L 29/808* (2013.01)

(58) Field of Classification Search
CPC .......... H01L 2924/0002; H01L 2924/00; H01L 29/7835; H01L 29/0847; H01L 27/088; H01L 27/098; H01L 29/7832
USPC ........ 257/262, E21.445, E29.256, 343; 438/194
See application file for complete search history.

(56) References Cited

U.S. PATENT DOCUMENTS

| 9,214,457 | B2 | 12/2015 | Tsuchiko | |
| 2008/0230812 | A1* | 9/2008 | Disney et al. | 257/272 |
| 2009/0294849 | A1* | 12/2009 | Min et al. | 257/337 |
| 2010/0271133 | A1* | 10/2010 | Bracale et al. | 330/277 |
| 2011/0241083 | A1* | 10/2011 | Khemka et al. | 257/262 |
| 2012/0104492 | A1 | 5/2012 | Chu et al. | |

* cited by examiner

*Primary Examiner* — David Vu
*Assistant Examiner* — Jonathan Han
(74) *Attorney, Agent, or Firm* — Van Pelt, Yi & James LLP

(57) ABSTRACT

A power integrated circuit includes a junction field effect transistor (JFET) device formed in a first portion of a semiconductor layer with a gate region being formed using a first body region, and a double-diffused metal-oxide-semiconductor (LDMOS) transistor formed in a second portion of the semiconductor layer with a channel being formed in a second body region. The power integrated circuit includes a first deep diffusion region formed under the first body region and in electrical contact with the first body region where the first deep diffusion region together with the firs body region establish a pinch off voltage of the JFET device; and a second deep diffusion region formed under the second body region and in electrical contact with the second body region where the second deep diffusion region forms a reduced surface field (RESURF) structure in the LDMOS transistor.

22 Claims, 4 Drawing Sheets

FORMING JFET AND LDMOS TRANSISTOR IN MONOLITHIC POWER INTEGRATED CIRCUIT USING DEEP DIFFUSION REGIONS

BACKGROUND OF THE INVENTION

Monolithic power integrated circuits (PICs) for high-voltage applications may sometimes integrate thereon a junction field effect transistor (JFET) and a lateral double-diffused metal-oxide-semiconductor (LDMOS) transistor. For instance, a JFET device may be incorporated in a power integrated circuit to use as a normally on pass device for a startup circuit. The JFET device may have a drain terminal connected to a power source terminal (e.g. 12V), a gate terminal that is grounded, and a source terminal connected to a power supply node for a load. As the power source ramps up, the JFET conducts current in a channel between the drain and the source terminal to provide power to certain circuitry of the load. When the power supply node (source terminal) to the load reaches the desired power supply voltage for the load (e.g. 5V), the JFET channel is pinched off and the JFET device is turned off. JFET devices are preferred in the normally on pass device application because of their good pinch off characteristic which ensures that circuitry downstream to the source terminal of the JFET is protected from the high voltage of the power source.

Meanwhile, LDMOS transistors are commonly used in high-voltage applications (20 to 500 volts) because of their high breakdown voltage characteristics and compatibility with CMOS technology for low voltage devices. In general, an LDMOS transistor includes a polysilicon gate, an N+ source region formed in a P-type body region, and an N+ drain region. The N+ drain region is separated from the channel formed in the body region under the polysilicon gate by an N drift region. It is well known that by increasing the length of the N drift region, the breakdown voltage of the LDMOS transistor can be accordingly increased.

When a JFET device and an LDMOS transistor are fabricated on the same integrated circuit, it is sometimes challenging to optimize the characteristics of both devices while maintaining a reasonably cost effective fabrication process. FIG. 1 is a cross-sectional view of a power integrated circuit including a JFET and an LDMOS transistor formed on the same semiconductor substrate in one example. When JFET 1 and LDMOS device 2 are manufactured using the same fabrication process, the devices have to be formed using the same diffusion regions available in the fabrication process. In particular, the traditional method for integrating a JFET into a LDMOS fabrication process uses the P-type body (P-body) region 4 of the LDMOS to form the gate region. However, the P-body implant is tailored for the threshold voltage in the channel and the breakdown voltage rating of the LDMOS transistor. The same P-body implant used as the gate region for the JFET device may not yield the desired pinch-off voltage to pinch off the transistor channel. For example, when the P-body implant is optimized for the LDMOS transistor threshold voltage and breakdown voltage, the JFET device may end up with a threshold voltage of 20V or more to pinch off the JFET conduction channel which is undesirable in the case where the JFET is coupled to supply circuitry operating at 5 volts. It is thus difficult to optimize both the JFET device and the LDMOS transistor in a power integrated circuit.

BRIEF DESCRIPTION OF THE DRAWINGS

Various embodiments of the invention are disclosed in the following detailed description and the accompanying drawings.

DETAILED DESCRIPTION

Figure 1:
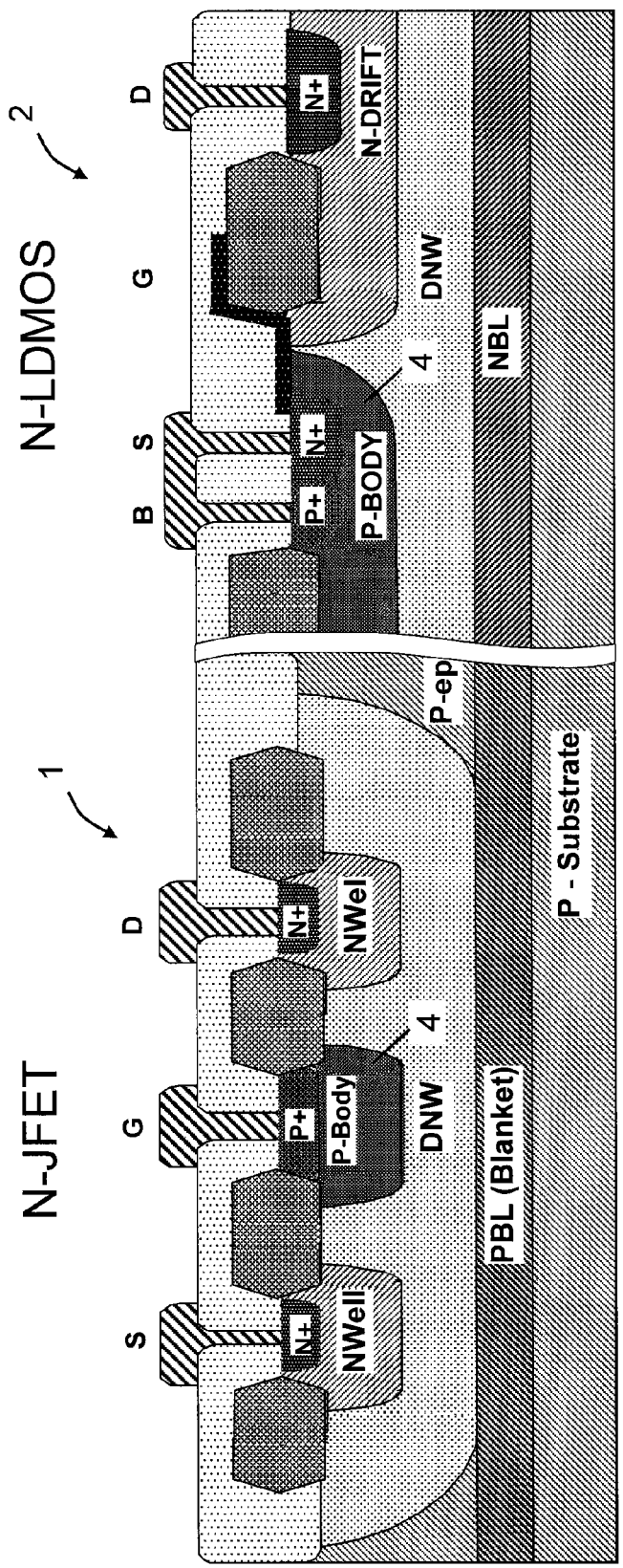
FIG. 1 is a cross-sectional view of a power integrated circuit including a JFET and an LDMOS transistor formed on the same semiconductor substrate in one example.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a method to form JFET and LDMOS transistor devices in a monolithic power integrated circuit uses the LDMOS body region to form the JFET gate region and further uses a deep diffusion regions formed under the body regions to optimize the electrical characteristics of both the JFET and the LDMOS devices. The deep diffusion regions have the same dopant conductivity type as the body region and are more heavily doped. In some embodiments, the deep diffusion regions may be formed using a single mask implantation process. Accordingly, the LDMOS body region is optimized for the desired threshold voltage and breakdown characteristics of the LDMOS transistor. Meanwhile, the deep diffusion regions are used to optimize the pinch-off voltage for the JFET device and also to reduce the on resistance (Rds-A) and to improve the reliability of the LDMOS transistor device. In this manner, a single deep diffusion process is used to optimize both the JFET device and the LDMOS transistor device.

In the present description, a junction field-effect transistor (JFET) refers to a semiconductor device where electric charge flows through a semiconducting channel between a source terminal and a drain terminal. The channel has a first conductivity type while a gate region is formed in the channel having a second, opposite conductivity type. JFET can be formed as an N-channel device with the channel formed using N-type conductivity or as a P-channel device with the channel formed using P-type conductivity. The operation of the JFET device is based on reverse-biasing the pn junction formed between the gate region and the channel to modulate the width of the depletion region formed at the gate-channel junction. Reverse-biasing the gate-channel pn junction controls the width of the depletion region which in turns controls the width of the remaining channel and hence the current flow from the drain to the source. The magnitude of the current flow between the drain and the source may also depend on the electric field or the applied voltage between the source and drain terminals, with the gate region biased to a fixed potential. In particular, by applying a reverse bias voltage to the gate region relative to the source region, the conducting channel is pinched by the depletion region so that the electric current is impeded or switched off completely. To switch off an N-channel JFET device, a negative gate-source voltage ($V_{GS}$) is used. Conversely, to switch off a P-channel JFET device, a positive gate-source voltage ($V_{GS}$) is used.

In embodiments of the present invention, the JFET device is constructed as an N-channel switch device and is referred to as an N-type JFET or N-JFET. The N-JFET device includes a semiconducting channel having N-type conductivity formed between a N+ region forming the source terminal and a N+ region forming the drain terminal. Furthermore, in embodiments of the present invention, an N-type LDMOS transistor includes a polysilicon gate, an N+ source region formed in a P-type body region, and an N+ drain region. The channel is formed in the P-type body region under the polysilicon gate. The N+ drain region is separated from the channel by an N drift region.

Figure 2:
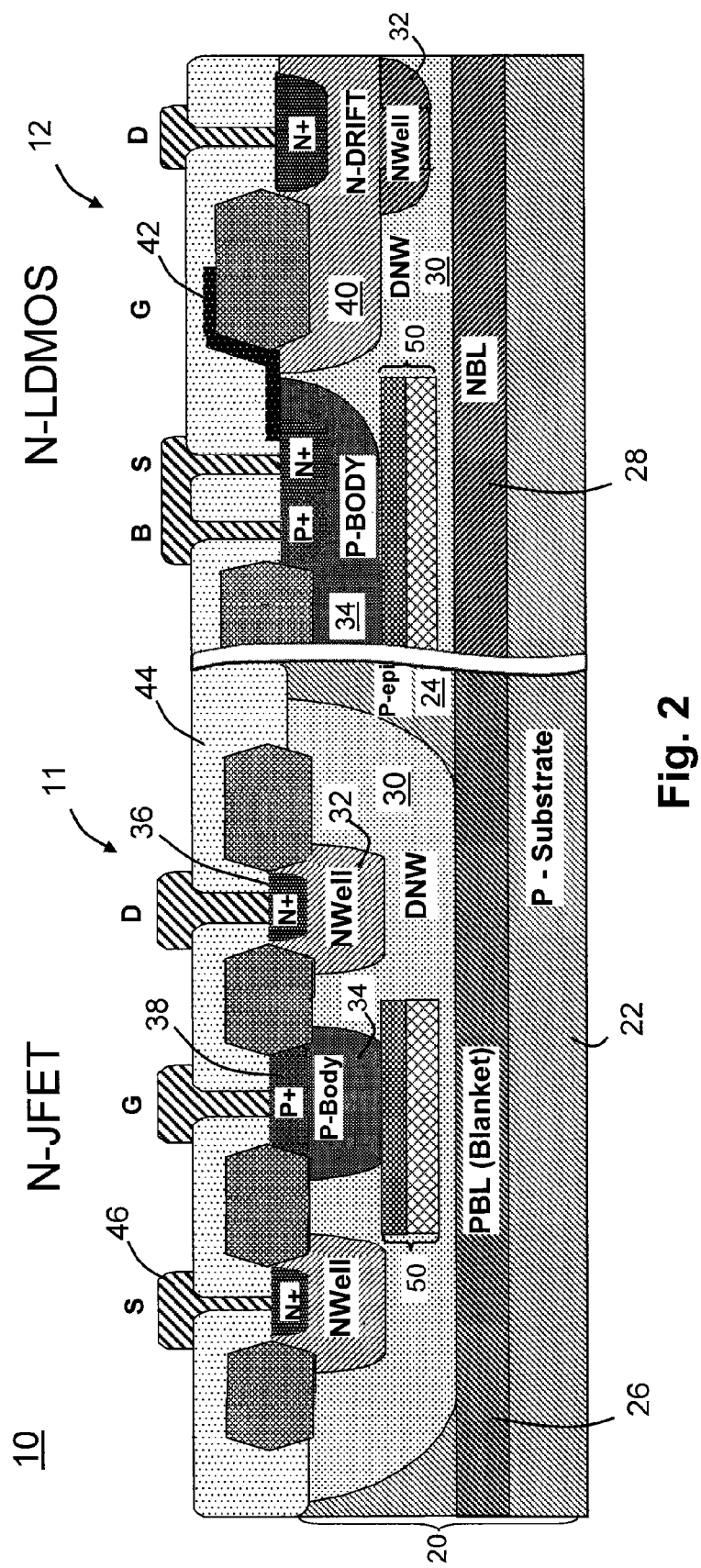
FIG. 2 is a cross-sectional view of a power integrated circuit including a JFET and an LDMOS transistor formed on the same semiconductor layer according to embodiments of the present invention.

FIG. 2 is a cross-sectional view of a power integrated circuit including a JFET and an LDMOS transistor formed on the same semiconductor layer according to embodiments of the present invention. Referring to FIG. 2, a power integrated circuit 10 includes a JFET device 11 and an LDMOS transistor device 12 formed on a P-type semiconductor layer 20. In some embodiments, the P-type semiconductor layer 20 includes a P-type substrate 22 with a P-type epitaxial layer 24 formed thereon. P-type buried layer 26 and N-type buried layer 28 may be formed on different areas of the substrate 22. In the following description, diffusion regions having the same reference numerals refer to diffusion regions of the same type that are formed using the same fabrication process steps, for example, the same implant dose and implant energy and the same thermal anneal process. Separate diffusion regions of the same type are defined by a mask and then formed on the semiconductor layer using the same fabrication process steps. Furthermore, in the present description, the term "diffusion region" refers to doped region formed in the semiconductor layer where the doped region is typically formed by ion implantation of dopants of a given conductivity type and annealing of the implanted dopants.

In the present embodiment, the JFET device is constructed as an N-channel JFET device including a semiconducting channel having N-type conductivity formed between a N+ region forming the source terminal and a N+ region forming the drain terminal. More specifically, in the present embodiment, the JFET device 11 is formed in a first portion of the semiconductor layer 20 on a P-type buried layer 26. The JFET device 11 includes a deep N-well region 30 forming the channel region of the transistor, N+ diffusion regions 36 formed in N-well regions 32 forming the source and drain regions of the transistor, and a P-body region 34 with a P+ diffusion region 38 formed therein to form the gate region. A dielectric layer 44 is formed on the semiconductor layer 20 and openings in the dielectric layer 44 are made to form contacts to the N+ and P+ diffusion regions. The source, drain and gate terminals of the JFET 11 are thus formed. The channel of the JFET 11 is formed in the deep N-well region 30.

In the present embodiment, the LDMOS transistor device 12 is constructed as an N-type LDMOS transistor device. The LDMOS transistor device 12 is formed in a second portion of the semiconductor layer 20 on an N-type buried layer 28. The LDMOS transistor device 12 is formed in a deep N-well region 30. The LDMOS transistor device 12 includes a lateral channel formed in a P-body region 34 under a gate electrode 42 and insulated from the gate electrode by a gate dielectric layer. An N+ region 36 and a P+ region 38 are formed in the P-body region 34 as the source region and the body contact region, respectively. The drain region is formed in an N+ region 36 that is formed spaced apart from the channel area by an N-drift region 40. A dielectric layer 44 is formed on the semiconductor layer 20 and openings in the dielectric layer 44 are made to form contacts to the N+ and P+ diffusion regions. The source, drain and body terminals of the LDMOS transistor 12 are thus formed.

In the present embodiment, the N+ drain region of the LDMOS transistor 12 is formed in an N-well 32. The use of the N-well at the drain region of the LDMOS transistor 12 has the benefits of reducing the drain resistance of the transistor and optimizing the breakdown voltage.

In the fabrication process used to form the power integrated circuit 10, the P-body region 34 has an implant dose and an implant energy that are selected to obtain the desired threshold voltage and the desired breakdown voltage for the LDMOS transistor. When the same P-body region 34 is used to form the gate region of the JFET device, the JFET device cannot be optimized. For example, the P-body region may be too shallow so that the JFET device has a higher than desired pinch off voltage.

In embodiments of the present invention, a deep diffusion region 50, having the same conductivity type as the LDMOS body region, is formed in the JFET device 11 and the LDMOS transistor 12 and positioned under the P-body region 34. In some embodiments, each deep diffusion region 50 is in electrical contact with the P-body region 34 to which it is situated. In other embodiments, the deep diffusion region 50 may be separated from the P-body region 34 and is left floating but connects to the P-body region 34 through a depletion region that forms in the deep N-well 30 between the deep diffusion region 50 and the P-body region 34. The depletion region between the deep diffusion region 50 and the P-body region 34 may be formed from the inherent built in potential of the semiconductor materials or formed by the reverse bias gate-to-source voltage. In some embodiments, the deep diffusion region 50 is formed using a single mask high energy implant process. Importantly, the same deep diffusion region 50 is used to optimize both the JFET device 11 and the LDMOS transistor 12. In particular, the deep diffusion region 50 is configured to optimize the pinch-off voltage of the JFET device 11 so that a desired pinch-off voltage value is obtained. Furthermore, the same deep diffusion region 50 forms a RESURF (reduced surface electric field) structure in the LDMOS transistor, thereby forming a RESURF LDMOS, which improves the resistance Rds-A of the LDMOS and also improves the device reliability.

In embodiments of the present invention, the deep diffusion region 50 has the same conductivity type as the body region of the LDMOS body region. Thus, the deep diffusion region 50 is a P-type diffusion region. Furthermore, the deep diffusion region 50 is more heavily doped than the P-body region 34. In some embodiment, the deep diffusion region 50 is formed using a single high energy implant process and has a uniform doping profile. In other embodiments, the deep diffusion region 50 can be formed using two or more high energy implant steps and the deep diffusion region 50 has a graded doping profile. The doping dose and energy are selected to tailor the pinch-off voltage of the JFET device and to improves the Rds-A of the LDMOS transistor.

In the present embodiment, the deep diffusion region 50 is formed using two high energy implantation steps and a graded doping profile is formed. In some embodiments, the doping concentration decreases gradually in a downward direction from the top surface of the semiconductor layer. In one embodiment, the first implant step is performed using 125% of the implant dose and 170% of the implant energy for the P-body region; and the second implant step is performed using 125% of the implant dose and 400% of the implant energy for the P-body region. After annealing, the deep diffusion region 50 includes a more heavily doped top layer and a more lightly doped but deeper bottom layer.

At the JFET device 11, the deep diffusion region 50 forms a deeper gate region, thereby forming a narrower channel in the deep N-well 30 and allowing the channel region to be pinched off at a lower pinch off voltage. In this manner, the deep diffusion region 50 tailors the pinch off voltage of the JFET device 11 to a desired voltage level for the application. For example, when the JFET device 11 is used as a start-up circuit in the power integrated circuit to connect the power source to downstream circuit. The power source may be at a high voltage level (e.g. 12V) and the downstream circuit may require a lower circuit voltage level (e.g. 5V). The JFET device 11 is tailored to have a pinch off voltage around the lower circuit voltage level, such as between 4-5V, so that the JFET device can be used effectively to protect the downstream circuit.

In some embodiments, the deep diffusion region 50 in the JFET device has a lateral dimension that is coincidence with the P-body region 34. In other embodiments, the deep diffusion region 50 can extend beyond the P-body region. Furthermore, in some embodiments, the deep diffusion region 50 is positioned spaced apart from the drain region of the JFET device, as shown in FIG. 2. In particular, the deep diffusion region 50 may be positioned close to the N-well of the source region but is positioned away from the N-well of the drain region. In some applications, the drain of the JFET device may be connected to a high voltage power source, such as 20V, while the source is connected to a low circuit voltage, such as 5V. Therefore, it is advantageous to have more spacing between the drain region and the deep diffusion region 50 to ensure a higher breakdown voltage. The source region is usually connected to a lower circuit voltage and a lower breakdown voltage can be sustained. Therefore, the spacing between the deep diffusion region 50 and the N-well of the source region can be made smaller than the spacing between the deep diffusion region 50 to the N-well of the drain region.

At the LDMOS transistor 12, the deep diffusion region 50 forms a RESURF structure to spread the electric field at the drain region of the LDMOS transistor. In some embodiments, the deep diffusion region 50 provides two dimensional electric field spreading so that the high electric field is pushed deeper into the semiconductor layer and away from the surface. In this manner, the reliability of the LDMOS transistor is improved. More specifically, the deep diffusion region 50 lowers the resistance Rds-A of the LDMOS transistor since the doping of the N-drift region 40 can be made higher due to charge coupling from the deep diffusion region 50. The reliability of the LDMOS transistor is improved as the electric field is not concentrated at the surface of the device. In some embodiments, the deep diffusion region 50 in the LDMOS transistor device has a lateral dimension that is coincidence with the P-body region 34. In other embodiments, the deep diffusion region 50 can extend beyond the P-body region and reach closer to the N-drift region 40 for better field spreading.

Figure 3:
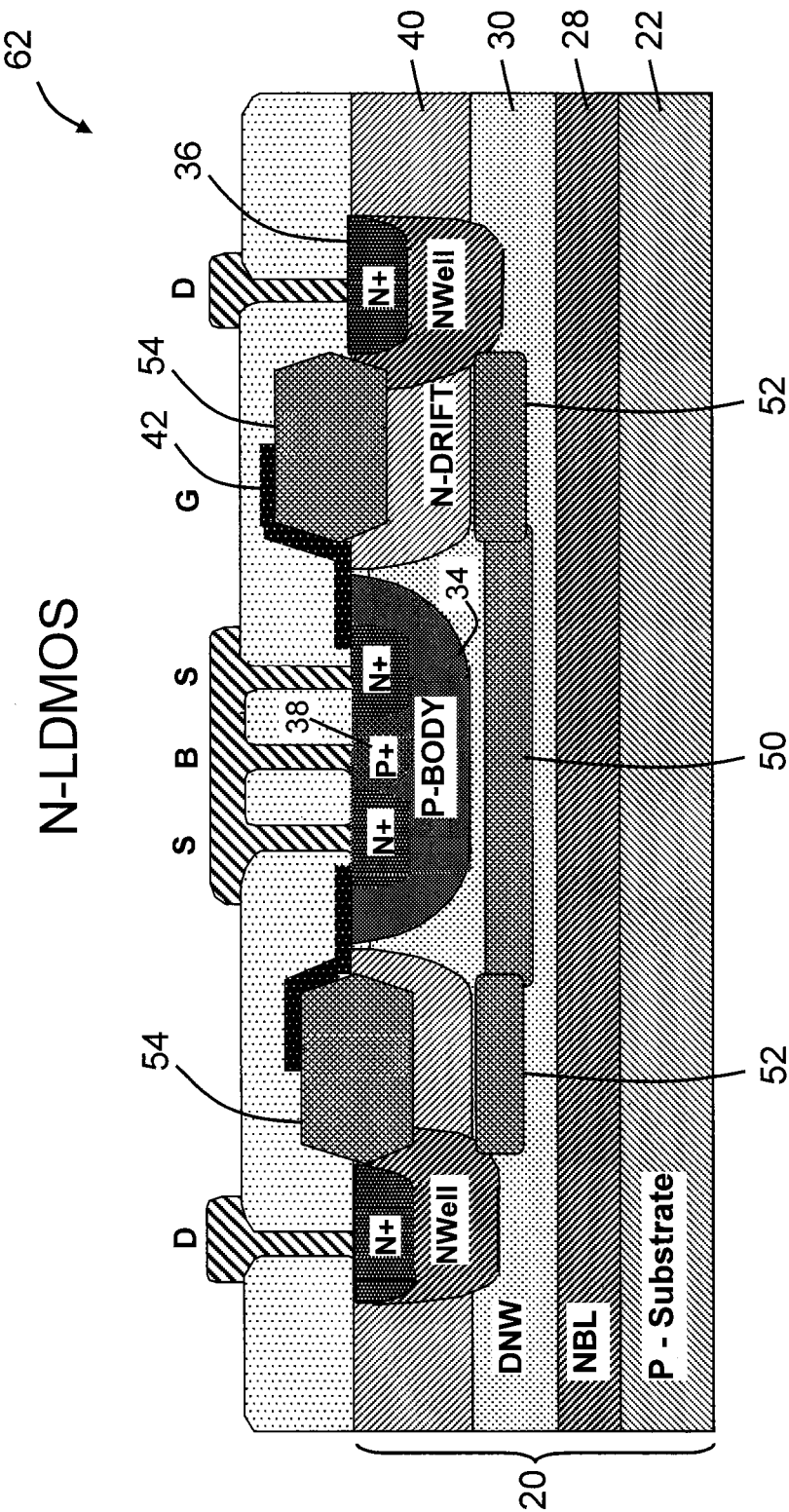
FIG. 3 is a cross-sectional view of an LMOS transistor in a power integrated circuit according to embodiments of the present invention.

FIG. 3 is a cross-sectional view of an LMOS transistor in a power integrated circuit according to embodiments of the present invention. FIG. 3 illustrates another embodiment of an LDMOS transistor which can be integrated with the JFET device of FIG. 2 in the power integrated circuit. Like elements in FIGS. 2 and 3 are given like reference numerals and will not be further described. Referring to FIG. 3, the LDMOS 62 has a circular layout with the N+ source and P-body region 34 being formed in the center and surrounded by the gate electrode 42 and the N-drift region 40. In embodiments of the present invention, the deep diffusion region 50 is formed under the P-body region 34 and also extends to under the N-drift region 40. Portions of the deep diffusion region 50 under the N-drift region 40 are denoted as regions 52. The deep diffusion regions 52 are not as deep as the deep diffusion region 50 because the implantation is performed through the thick field oxide layer 54. The deep diffusion regions 52 extend the RESURF structure and further improve the reliability of the LDMOS transistor.

Figure 4:
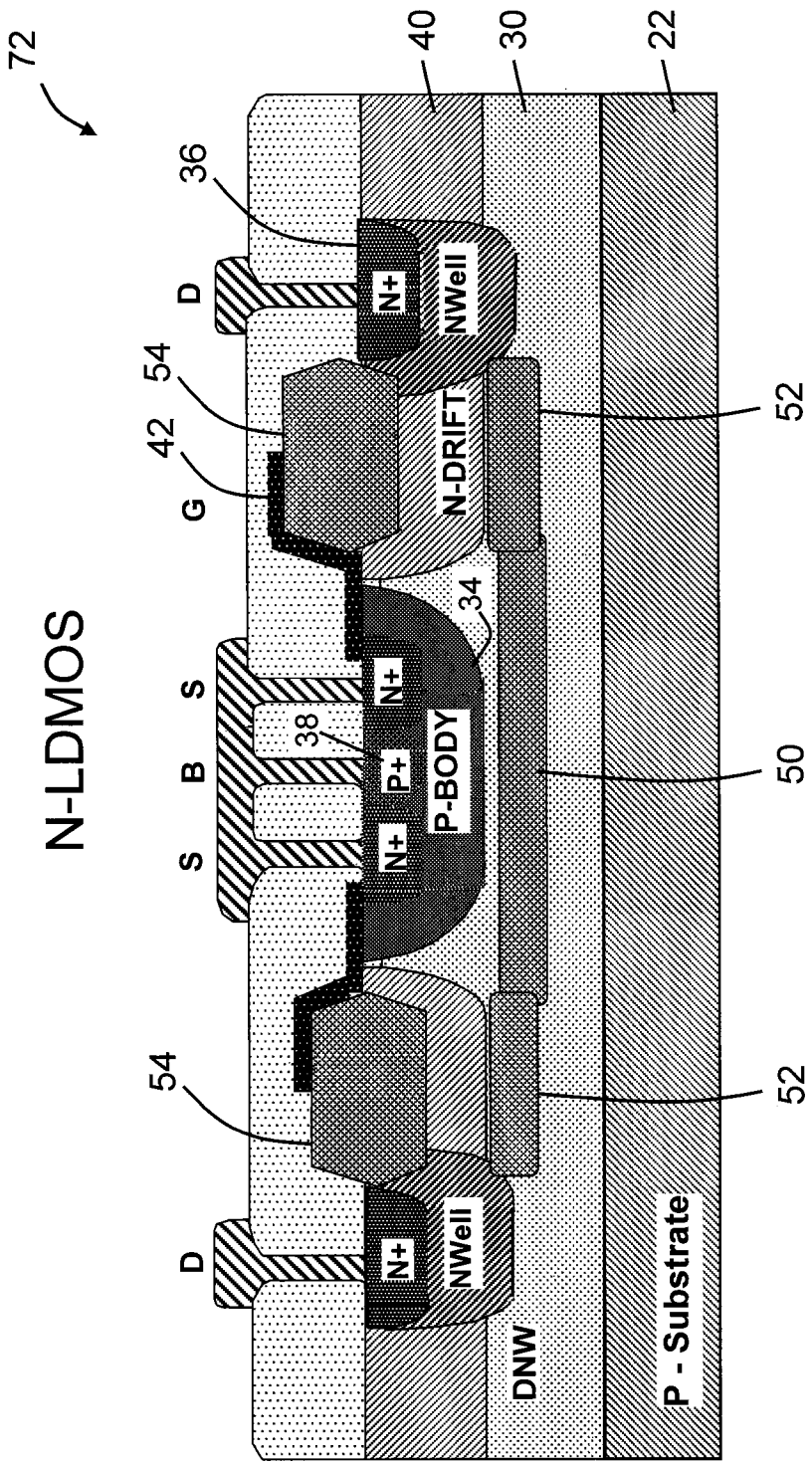
FIG. 4 illustrates a non-isolated LDMOS transistor formed in the same manner as the LDMOS transistor of FIG. 3 with the N-type buried layer omitted in some embodiments of the present invention.

FIG. 3 illustrates an isolated LDMOS transistor formed on the N-type buried layer 28. The isolated LDMOS transistor can be used in the high-side circuitry in the power integrated circuit. In other embodiments, the LDMOS transistor of FIG. 3 can be constructed as a non-isolated LDMOS transistor by omitting the N-type buried layer. FIG. 4 illustrates a non-isolated LDMOS transistor formed in the same manner as the LDMOS transistor of FIG. 3 with the N-type buried layer omitted. The non-isolated LDMOS transistor 72 of FIG. 4 includes the deep diffusion region 50 with portions 52 extending under the N-drift region 40.

In some embodiments, the following fabrication process sequence can be used to fabricate the power integrated circuit 10 of FIG. 2. First, a p-type substrate is provided. Then, the buried layers are formed. In some cases, the N-type buried layer is formed selectively and the P-type buried layer is formed everywhere N-type buried layer is absent. Then, the epitaxial layer is grown. The deep N-well and the N-well are then formed. Field oxide is grown to define active area of the power integrated circuit. Then, the P-body region is formed. At this point, the deep diffusion region is then formed by using a high energy implant process through the P-body region and the field oxide layer, if applicable. The remaining processing steps includes gate oxidation to form the gate oxide, forming the gate electrode and forming the N+ and P+ diffusion regions.

In alternate embodiments of the present invention, the deep diffusion region can be formed using a multiple epitaxial layer process instead of high energy implantation. Thus, the epitaxial layer is formed to a first thickness and then an implantation step is performed to form the deep diffusion region. Then, the remaining portion of the epitaxial layer may be formed. In this manner, the deep diffusion region is formed buried in the epitaxial at a depth deeper than the P-body region to be formed. In other embodiments, multiple epitaxial and implantation process can be performed to form a graded doping profile at the deep diffusion region.

In the above description, the JFET device and the LDMOS transistor device are both N-type devices. One of ordinary skill in the art would appreciate that P-type JFET device and P-type LDMOS transistor can be formed using semiconductor material and diffusion regions of the opposite polarity types.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power integrated circuit, comprising:
   a semiconductor layer of a first conductivity type and being lightly doped;
   a junction field effect transistor (JFET) device formed in a first portion of the semiconductor layer and being formed in a first deep well of a second conductivity type, the JFET device comprising a gate region formed using a first body region of the first conductivity type, source and drain regions of the second conductivity type formed on opposite sides of the gate region, the first body region, the source and drain regions of the JFET device being formed on a first surface of the semiconductor layer, a channel of the JFET device being formed in an area of the first deep well between the source region and the drain region outside of the gate region;
   a double-diffused metal-oxide-semiconductor (LDMOS) transistor formed in a second portion of the semiconductor layer and being formed in a second deep well of the second conductivity type, the LDMOS transistor comprising a second body region of the first conductivity type formed in the second deep well, a gate electrode, a source region, and a drain drift region in electrical contact with a drain region, the source region, the drain drift region and the drain region being of the second conductivity type, the second body region, the source region the drain drift region, and the drain region being formed on the first surface of the semiconductor layer, a channel of the LDMOS transistor being formed in the second body region between the source region and the drain drift region, wherein the second body region is formed to optimize a threshold voltage and a breakdown voltage of the LDMOS transistor and the first and second body regions have the same doping concentration and the same doping depth;
   a first deep diffusion region formed in the first deep well under the first body region and in electrical contact with the first body region, the first deep diffusion region together with the first body region establishing a pinch off voltage of the JFET device; and
   a second deep diffusion region formed in the second deep well under the second body region and in electrical contact with the second body region, the second deep diffusion region forming a reduced surface field (RESURF) structure in the LDMOS transistor.

2. The power integrated circuit of claim 1, wherein the LDMOS transistor further comprises:
   the gate electrode being formed partially overlapping the body region and insulated from the semiconductor body by a gate dielectric layer;
   the source region of the second conductivity type being formed in the second body region on a first side of the gate electrode; and
   the drain drift region of the second conductivity type being formed in the second deep well; and
   a drain region being formed in the drain drift region, the drain region comprising a first well of the second conductivity type.

3. The power integrated circuit of claim 1, wherein the semiconductor layer comprises:
   a semiconductor substrate of the first conductivity type; and
   an epitaxial layer of the first conductivity type formed on the semiconductor substrate.

4. The power integrated circuit of claim 1, wherein the first and second body regions are formed using the same processing steps including using the same implant dose and the same implant energy, the implant dose and the implant energy being selected to optimize a threshold voltage and a breakdown voltage of the LDMOS transistor.

5. The power integrated circuit of claim 1, wherein the first and second deep diffusion regions are formed using the same processing steps and have the same doping concentration and depth, the first and second deep diffusion regions being more heavily doped than the first and second body regions.

6. The power integrated circuit of claim 5, wherein the first and second deep diffusion regions have a graded doping profile, the doping concentration decreasing from a first edge of the first or second deep diffusion region near the respective body region to a second edge away from the respective body region.

7. The power integrated circuit of claim 1, wherein the first deep diffusion region has a width that is coincidence with the first body region or extends beyond the first body region on both sides of the first body region.

8. The power integrated circuit of claim 7, wherein the first deep diffusion region is spaced apart from the drain region by a first distance and is spaced apart from the source region by a second distance, the first distance being greater than the second distance.

9. The power integrated circuit of claim 1, wherein the second deep diffusion region has a width that is coincidence with the second body region or extends beyond the second body region towards the drain drift region or extends under the drain drift region.

10. The power integrated circuit of claim 1, wherein the first conductivity type is P-type and the second conductivity type is N-type.

11. The power integrated circuit of claim 3, further comprising:
    a first buried layer of the first conductivity type formed in the first portion of the semiconductor layer between the epitaxial layer and the semiconductor substrate; and
    a second buried layer of the second conductivity type formed in the second portion of the semiconductor layer between the epitaxial layer and the semiconductor substrate.

12. A method for forming a power integrated circuit, comprising:
    providing a semiconductor layer of a first conductivity type and being lightly doped;
    forming a first deep well of a second conductivity type in a first portion of the semiconductor layer;
    forming a second deep well of the second conductivity type in a second portion of the semiconductor layer;
    forming a first body region of the first conductivity type in the first deep well and on a first surface of the semiconductor layer, the first body region being a gate region of a junction field effect transistor (JFET) device;

forming a second body region of the first conductivity type in the second deep well and on the first surface of the semiconductor layer, the second body region forming a channel of a double-diffused metal-oxide-semiconductor (LDMOS) transistor, wherein the second body region is formed to optimize a threshold voltage and a breakdown voltage of the LDMOS transistor and the first and second body regions have the same doping concentration and the same doping depth;

forming a gate electrode, a source region, a drain drift region and a drain region in the second portion of the semiconductor layer, the source region, the drain drift region and the drain region being of the second conductivity type and being formed in the second deep well, a channel of the LDMOS transistor being formed in the second body region between the source region and the drain drift region;

forming a first deep diffusion region in the first deep well under the first body region and in electrical contact with the first body region, the first deep diffusion region together with the first body region establishing a pinch off voltage of the JFET device; and forming a second deep diffusion region in the second deep well under the second body region and in electrical contact with the second body region, the second deep diffusion region forming a reduced surface field (RESURF) structure in the LDMOS transistor.

13. The method of claim 12, further comprising:
forming source and drain regions of the second conductivity type on opposite sides of the gate region in the first portion of the semiconductor layer, a channel of the JFET device being formed in an area of the first deep well between the source region and the drain region outside of the gate region.

14. The method of claim 12, further comprising:
forming the drain region using a first well of the second conductivity type.

15. The method of claim 12, wherein forming the first body region and forming the second body region comprises:
forming the first body region and the second body region using the same processing steps including the same implant dose and the same implant energy, the implant dose and the implant energy being selected to optimize a threshold voltage and a breakdown voltage of the LDMOS transistor.

16. The method of claim 12, wherein forming the first deep diffusion region and forming the second deep diffusion region comprises:
forming the first and second deep diffusion regions using the same processing steps and have the same doping concentration and depth, the first and second deep diffusion regions being more heavily doped than the first and second body regions.

17. The method of claim 16, wherein forming the first deep diffusion region and forming the second deep diffusion region comprises:
forming the first and second deep diffusion regions to have a graded doping profile, the doping concentration decreasing from a first edge near the respective body region to a second edge away from the respective body region.

18. The method of claim 17, wherein forming the first and second deep diffusion regions to have a graded doping profile comprises:
performing a first ion implantation of dopants of the first conductivity type through a first mask defining the first and second deep diffusion regions and using a first implant dose and a first implant energy; and
performing a second ion implantation of dopants of the first conductivity type through the first mask and using a second implant dose and a second implant energy, the second implant energy greater than the first implant energy.

19. The method of claim 12, wherein forming the first deep diffusion region comprises:
forming the first deep diffusion region to have a width that is coincidence with the first body region or extends beyond the first body region on both sides of the first body region.

20. The method of claim 19, wherein forming the first deep diffusion region comprises:
forming the first deep diffusion region that is spaced apart from the drain region by a first distance and is spaced apart from the source region by a second distance, the first distance being greater than the second distance.

21. The method of claim 12, wherein forming the second deep diffusion region comprises:
forming the second deep diffusion region to have a width that is coincidence with the second body region or extends beyond the second body region towards the drain drift region or extends under the drain drift region.

22. The method of claim 12, wherein the first conductivity type is P-type and the second conductivity type is N-type.

* * * * *

UNITED STATES PATENT AND TRADEMARK OFFICE
CERTIFICATE OF CORRECTION

Page 1 of 1

PATENT NO.         : 9,460,926 B2
APPLICATION NO.    : 14/320434
DATED              : October 4, 2016
INVENTOR(S)        : Shekar Mallikarjunaswamy It is certified that error appears in the above-identified patent and that said Letters Patent is hereby corrected as shown below:

In the Claims

In Column 9, Line 1, before "the first body region", delete "laver,", and insert --layer,-- therefor.
In Column 9, Line 6, after "the semiconductor", delete "laver,", and insert --layer,-- therefor.

Signed and Sealed this
Eighteenth Day of April, 2017

Michelle K. Lee
*Director of the United States Patent and Trademark Office*